`US007319863B2`

United States Patent
Engstrom et al.

(10) Patent No.: US 7,319,863 B2
(45) Date of Patent: Jan. 15, 2008

(54) METHOD AND SYSTEM FOR PROVIDING AN OPINION AND AGGREGATING OPINIONS WITH MOBILE TELECOMMUNICATION DEVICE

(75) Inventors: G. Eric Engstrom, Kirkland, WA (US); Peter Zatloukal, Duvall, WA (US)

(73) Assignee: Wildseed, Ltd., Seattle, WA (US)

( * ) Notice: Subject to any disclaimer, the term of this patent is extended or adjusted under 35 U.S.C. 154(b) by 179 days.

(21) Appl. No.: 10/477,164

(22) PCT Filed: May 10, 2002

(86) PCT No.: PCT/US02/14908

§ 371 (c)(1),
(2), (4) Date: Nov. 7, 2003

(87) PCT Pub. No.: WO02/093800

PCT Pub. Date: Nov. 21, 2002

(65) Prior Publication Data

US 2004/0235460 A1 Nov. 25, 2004

Related U.S. Application Data

(60) Provisional application No. 60/290,592, filed on May 11, 2001.

(51) Int. Cl.
*H04L 29/06* (2006.01)
(52) U.S. Cl. ............................. 455/414.3; 455/186.01; 455/458; 455/466; 455/560; 455/426.1; 379/92.04; 379/31

(58) Field of Classification Search ............ 455/414.3, 455/186.01, 458, 466, 560, 426.1; 379/92.04, 379/31
See application file for complete search history.

(56) References Cited

U.S. PATENT DOCUMENTS

| 5,749,043 | A | 5/1998 | Worthy | |
|---|---|---|---|---|
| 6,253,069 | B1* | 6/2001 | Mankovitz | 455/186.1 |
| 6,324,266 | B1* | 11/2001 | Mannings | 379/92.04 |
| 6,418,308 | B1* | 7/2002 | Heinonen et al. | 455/414.3 |
| 6,628,928 | B1* | 9/2003 | Crosby et al. | 455/77 |
| 2002/0055926 | A1* | 5/2002 | Dan et al. | 707/100 |
| 2002/0128908 | A1* | 9/2002 | Levin et al. | 705/14 |

* cited by examiner

*Primary Examiner*—Joseph Feild
*Assistant Examiner*—Pierre-Louis Desir
(74) *Attorney, Agent, or Firm*—Schwabe, Williamson & Wyatt, P.C.

(57) ABSTRACT

A mobile device (620) provides an opinion system (600) for receiving opinions from a user and displaying results relating to the received opinion. Opinion user interface elements (621-622) receive input relating to the item of the opinion. The opinion is aggregated with other opinions received from other mobile devices and the result is provided to the user. A probability thereon may be applied to the aggregated opinions, and may be used to generate estimates of probability for a users propensity to an item based on the user's preferences.

34 Claims, 14 Drawing Sheets

METHOD AND SYSTEM FOR PROVIDING AN OPINION AND AGGREGATING OPINIONS WITH MOBILE TELECOMMUNICATION DEVICE

RELATED APPLICATION

This utility application is related to a previously filed U.S. Provisional Application, Ser. No. 60/290,592, filed on May 11, 2001, the benefit of the earlier filing date of which is hereby claimed under 35 U.S.C. § 119(e).

FIELD OF THE INVENTION

The present invention is related to mobile telecommunication devices, and more specifically to providing opinions and receiving aggregated results with a mobile telecommunication device.

BACKGROUND OF THE INVENTION

Since their introduction, the number of services and features for cellular telephones has steadily increased. At first, these mobile devices operated on analog wireless networks that enabled voice communication and simple paging features. Later, digital wireless networks for cellular telephones were implemented to provide more advanced features for voice and data communication, such as encryption, caller identification and short message service (SMS) text messages. More recently, some cellular telephones enable the browsing of web pages on the Internet or other on-line services.

The functionality of cellular telephones has continued to increase and incorporate many of the features originally provided for in handheld electronic devices such as personal digital assistants (PDAs). Relatively simple PDA features such as keeping a list of contacts, a calendar, appointments, and the like have been generally integrated into recent cellular telephone models. However, a user has not been able to readily give or receive opinions with a cellular telephone. Typically, a cellular telephone user has to access a separate source to be able to express an opinion about an item or receive opinions regarding a particular item.

SUMMARY OF THE INVENTION

The present invention is directed to obtaining an opinion about an item and receiving aggregated data based on the opinions expressed about the item with a mobile telecommunication device. The opinions are obtained by selecting at least one element of a user interface on the mobile telecommunication device. When an opinion is expressed it is stored and aggregated with other opinions regarding the item. The personal preferences of the user who expressed the opinion are updated based on the opinion.

According to one aspect of the invention, the user evaluates an item and uses the selection of at least one element of the user interface on a mobile device to express an opinion about the item. For example, the selection of one element of the user interface may be used to express a positive opinion and the selection of another user interface element can be used to express a negative opinion. The mobile device transmits the opinion to a server when the positive opinion or negative opinion is indicated by the selection of at least one element of the user interface.

In yet another aspect of the invention, the personal preferences of the user are updated whenever the user expresses an opinion. This helps to improve the weighting associated with estimating whether or not a user will have a positive opinion or negative opinion about some other item.

In still another aspect of the invention, the opinions are aggregated and may be presented to the user. A probability theorem is used to measure the values of the user opinions and weight the opinions from various groups of users accordingly.

In a further aspect of the invention, the user is provided with information meeting his or her preferences. The user may select what items he or she would like to be notified about.

In yet another aspect of the invention, the item of the opinion is identified and is stored with the opinion in a database. The item may be identified in many different ways. The target may be identified by location, current message data, broadcasts, input, and the like.

Another aspect of the invention is providing real-time aggregated opinion data to a mobile device. As opinions are expressed about the item the display of the mobile device is updated.

These and various other features as well as advantages, which characterize the present invention, will be apparent from a reading of the following detailed description and a review of the associated drawings.

DETAILED DESCRIPTION OF THE PREFERRED EMBODIMENT

Figure 1:
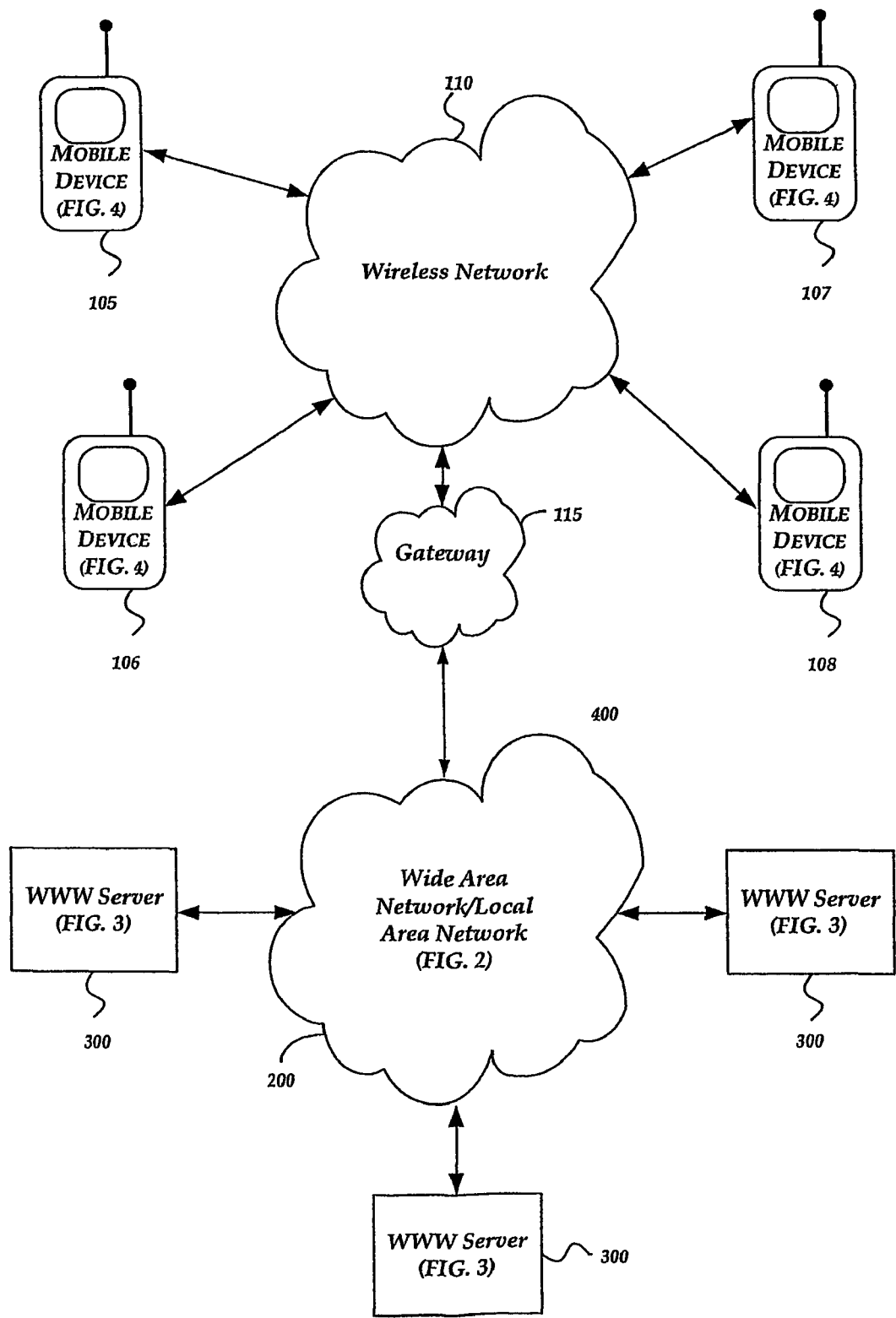
FIG. 1 is a schematic diagram that shows an exemplary system overview.

In the following detailed description of exemplary embodiments of the invention, reference is made to the accompanied drawings, which form a part hereof, and which is shown by way of illustration, specific exemplary embodiments of which the invention may be practiced. Each embodiment is described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification and claims, the following terms take the meanings explicitly associated herein, unless the context clearly dictates otherwise. The term "a broadcast spectrum" means any portion or portions of the range of frequencies, channels, or Internet addresses employed for broadcasting that can be selected for tuning in conjunction with the practice of the invention disclosed herein. The term "broadcast" includes but is not limited to commercial and non-commercial radio and television stations, Internet radio and the like. The term "user preference" can include a plurality of elements. For example, a user preference for disco music circa 1980 has at least two elements, i.e., the type of music and the era. The term "item" or "target item" includes anything on which an opinion may be expressed. The term "user interface" can include any type of element that is selectable on a mobile device, including, but not limited to, push-button, rocker switch, slider, dial, key, mouse, pointer, touch-sensitive pad, touch sensitive screen, and soft key.

Referring to the drawings, like numbers indicate like parts throughout the views. Additionally, a reference to the singular includes a reference to the plural unless otherwise stated or is inconsistent with the disclosure herein.

The present invention is directed to obtaining an opinion about an item and receiving aggregated data based on the opinions expressed about the item with a mobile telecommunication device. The opinions are obtained by selecting at least one user interface element on the mobile telecommunication device. When an opinion is expressed, it is stored and aggregated with other opinions regarding the item. The personal preferences of the user who expressed the opinion are updated based on the opinion.

Illustrative Operating Environment

With reference to FIG. 1, an exemplary system in which the invention operates includes wireless mobile devices 105-108, wireless network 110, gateway 115, wide area network (WAN)/local area network (LAN) 200 and one or more world wide web (WWW) servers 300.

Figure 4:
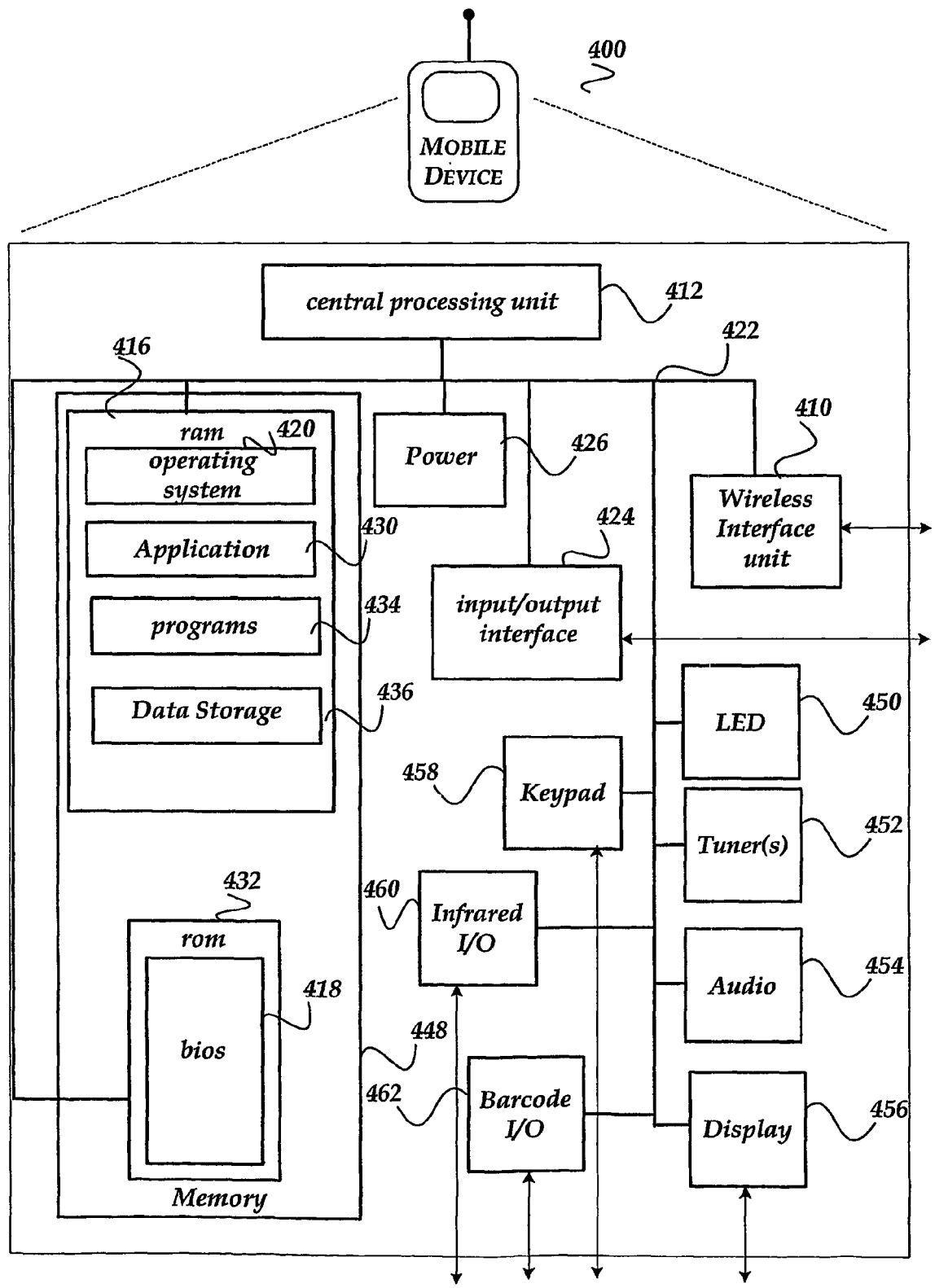
FIG. 4 is a schematic diagram that illustrates an exemplary mobile device.

Wireless devices 105-108 are coupled to wireless network 110 and are described in more detail in conjunction with FIG. 4. Generally, mobile devices 105-108 include any device capable of connecting to a wireless network such as wireless network 110. Such devices include cellular telephones, smart phones, pagers, radio frequency (RF) devices, infrared (IR) devices, citizen band radios (CBs), integrated devices combining one or more of the preceding devices, and the like. Mobile devices 105-108 may also include other devices that have a wireless interface such as PDAs, handheld computers, personal computers, multiprocessor systems, microprocessor-based or programmable consumer electronics, network PCs, wearable computers, and the like. In other words, as those of ordinary skill in the art would appreciate, mobile devices 105-108 represent a broad range of electronic devices, at least some of mobile devices 105-108 having bodies with relatively small dimensions designed to provide ease of mobility, making mobile usage by the users possible.

Wireless network 110 transports information to and from devices capable of wireless communication, such as mobile devices 105-108. Wireless network 110 may include both wireless and wired components. For example, wireless network 110 may include a cellular tower that is linked to a wired telephone network. Typically, the cellular tower carries communication to and from cell phones, pagers, and other wireless devices, and the wired telephone network carries communication to regular phones, long-distance communication links, and the like.

Wireless network 110 is coupled to WAN/LAN through gateway 115. Gateway 115 routes information between wireless network 110 and WAN/LAN 200. For example, a user using a wireless device may browse the Internet by calling a certain number or tuning to a particular frequency. Upon receipt of the number, wireless network 110 is configured to pass information between the wireless device and gateway 115. Gateway 115 may translate requests for web pages from wireless devices to hypertext transfer protocol (HTTP) messages, which may then be sent to WAN/LAN 200. Gateway 115 may then translate responses to such messages into a form compatible with the requesting device. Gateway 115 may also transform other messages sent from wireless devices 105-108 into information suitable for WAN/LAN 200, such as e-mail, audio, voice communication, contact databases, calendars, appointments, and the like.

Figure 2:
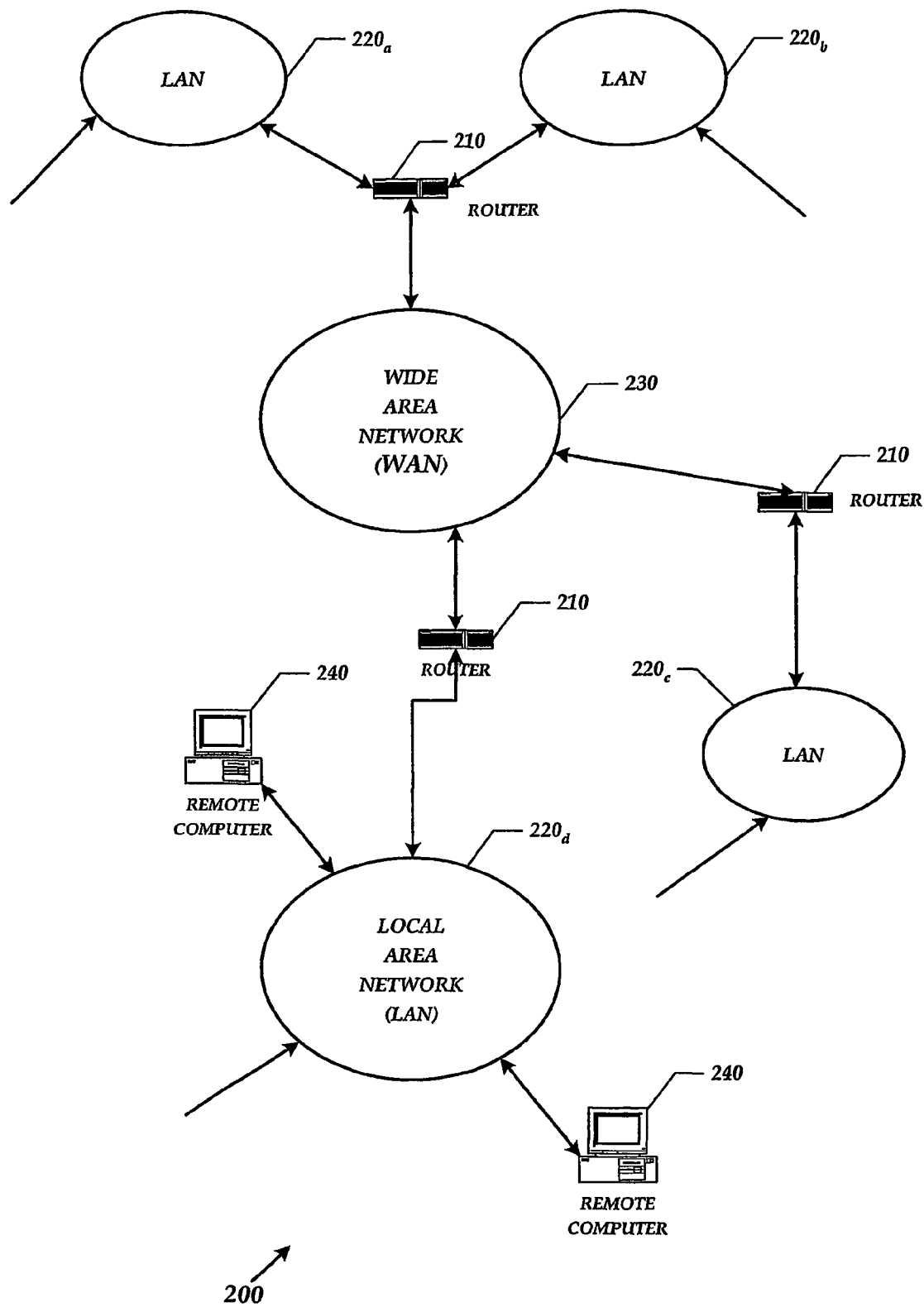
FIG. 2 is a schematic diagram that illustrates an exemplary system overview in which local area networks and a wide area network are interconnected by routers.

Typically, WAN/LAN 200 transmits information between computing devices as described in more detail in conjunction with FIG. 2. One example of a WAN is the Internet, which connects millions of computers over a host of gateways, routers, switches, hubs, and the like. An example of a LAN is a network used to connect computers in a single office. A WAN may connect multiple LANs.

WWW servers 300 are coupled to WAN/LAN 200 through communication mediums. WWW servers 300 provide access to information and services as described in more detail in conjunction with FIG. 3.

FIG. 2 shows another exemplary system in which the invention operates in which a number of local area networks ("LANs") $220_{a-d}$ and wide area network ("WAN") 230 interconnected by routers 210. Routers 210 are intermediary devices on a communications network that expedite message delivery. On a single network linking many computers through a mesh of possible connections, a router receives transmitted messages and forwards them to their correct destinations over available routes. On an interconnected set of LANs—including those based on differing architectures and protocols—, a router acts as a link between LANs, enabling messages to be sent from one to another. Communication links within LANs typically include twisted wire pair, fiber optics, or coaxial cable, while communication links between networks may utilize analog telephone lines, full or fractional dedicated digital lines including T1, T2, T3, and T4, Integrated Services Digital Networks (ISDNs), Digital Subscriber Lines (DSLs), wireless links, or other communications links. Furthermore, computers, such as remote computer 240, and other related electronic devices can be remotely connected to either LANs $220_{a-d}$ or WAN 230 via a modem and temporary telephone link. The number of WANs, LANs, and routers in FIG. 2 may be increased or decreased without departing from the spirit or scope of this invention. As such, it will be appreciated that the Internet itself may be formed from a vast number of such interconnected networks, computers, and routers and that an embodiment of the invention could be practiced over the Internet without departing from the spirit and scope of the invention.

The media used to transmit information in communication links as described above illustrates one type of computer-readable media, namely communication media. Generally, computer-readable media includes any media that can be accessed by a computing device. Computer-readable media may include computer storage media, communication media, or any combination thereof.

Communication media typically embodies computer-readable instructions, data structures, program modules, or other data in a modulated data signal such as a carrier wave or other transport mechanism and includes any information delivery media The term "modulated data signal" means a signal that has one or more of its characteristics set or changed in such a manner as to encode information in the signal. By way of example, communication media includes wired media such as twisted pair, coaxial cable, fiber optics, wave guides, and other wired media and wireless media such as acoustic, RF, infrared, and other wireless media.

The Internet has recently seen explosive growth by virtue of its ability to link computers located throughout the world. As the internet has grown, so has the WWW. Generally, the WWW is the total set of interlinked hypertext documents residing on HTTP servers around the world. Documents on the WWW, called pages or Web pages, are typically written in HTML (Hypertext Markup Language) or some other markup language, identified by URLs (Uniform Resource Locators) that specify the particular machine and path name by which a file can be accessed, and transmitted from server to end user using HTTP. Codes, called tags, embedded in an HTML document associate particular words and images in the document with URLs so that a user can access another file, which may literally be halfway around the world, at the press of a key or the click of a mouse. These files may contain text (in a variety of fonts and styles), graphics images, movie files, media clips, and sounds as well as Java applets, ActiveX controls, or other embedded software programs that execute when the user activates them. A user visiting a Web page also may be able to download files from an FTP site and send messages to other users via email by using links on the Web page.

Figure 3:
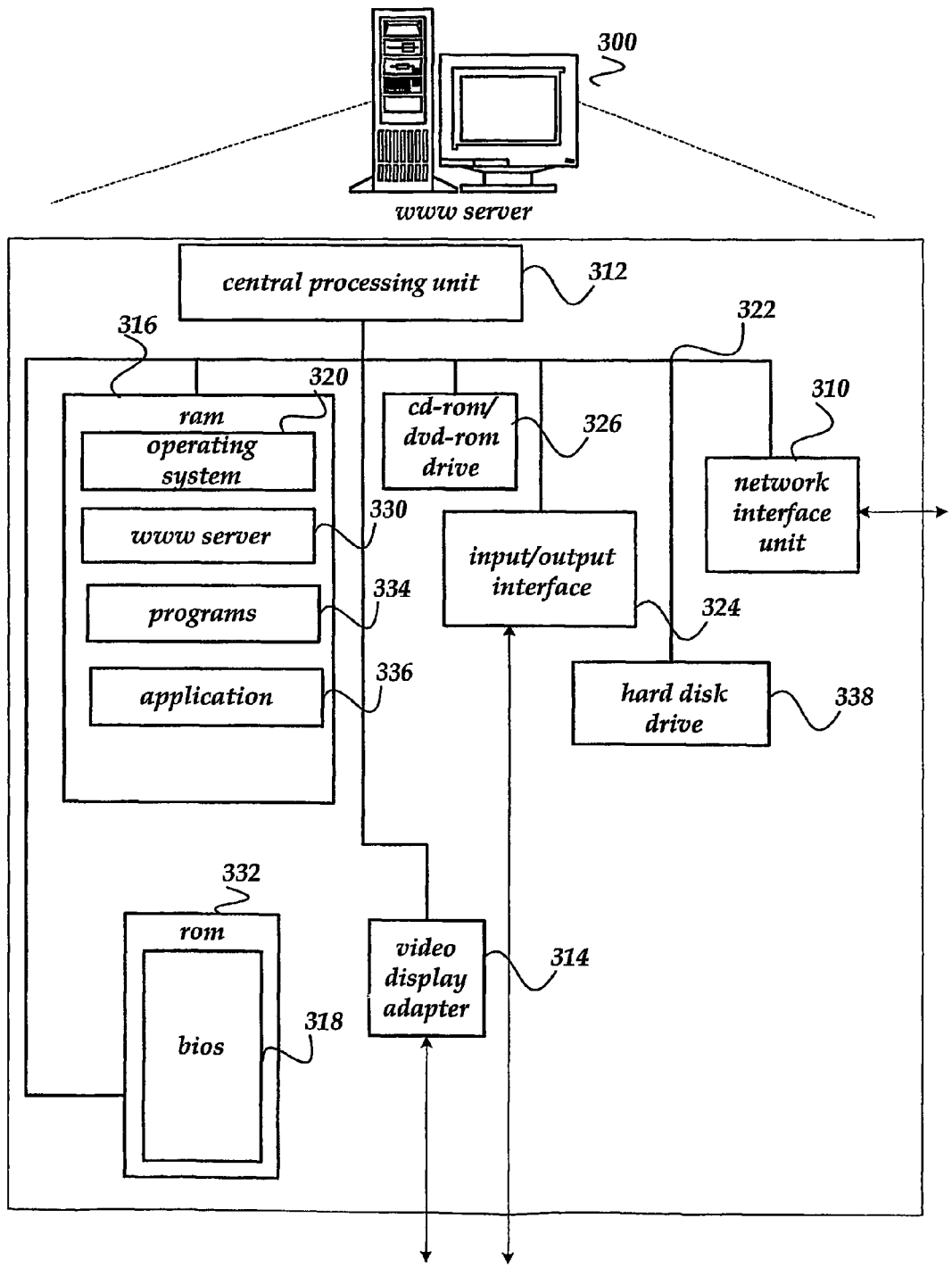
FIG. 3 is a schematic diagram that shows an exemplary server that is operative to provide a web site.

A WWW server, as described in more detail in conjunction with FIG. 3, is a computer connected to the Internet having storage facilities for storing hypertext documents for a WWW site and running administrative software for handling requests for the stored hypertext documents. A hypertext document normally includes a number of hyperlinks, i.e., highlighted portions of text which link the document to another hypertext document possibly stored at a WWW site elsewhere on the Internet. Each hyperlink is associated with a URL that provides the location of the linked document on a server connected to the Internet and describes the document. Thus, whenever a hypertext document is retrieved from a WWW server, the document is considered to be retrieved from the WWW. A WWW server may also include facilities for storing and transmitting application programs, such as application programs written in the JAVA programming language from Sun Microsystems, for execution on a remote computer. Likewise, a WWW server may also include facilities for executing scripts and other application programs on the WWW server itself.

A user may retrieve hypertext documents from the WWW via a WWW browser application program located on a wired or wireless device. A WWW browser, such as Netscape's NAVIGATOR® or Microsoft's INTERNET EXPLORER®, is a software application program for providing a graphical user interface to the WWW. Upon request from the user via the WWW browser, the WWW browser accesses and retrieves the desired hypertext document from the appropriate WWW server using the URL for the document and HTTP. HTTP is a higher-level protocol than TCP/IP and is designed specifically for the requirements of the WWW. HTTP is used to carry requests from a browser to a Web server and to transport pages from Web servers back to the requesting browser or client. The WWW browser may also retrieve application programs from the WWW server, such as JAVA applets, for execution on a client computer.

FIG. 3 shows an exemplary WWW server 300 that is operative to provide a WWW site. Accordingly, WWW server 300 transmits WWW pages to the WWW browser application program executing on requesting devices to carry out this process. For instance, WWW server 300 may transmit pages and forms for receiving information about a user, such a user preferences, address, telephone number, billing information, credit card numbers, and the like. Moreover, WWW server 300 may transmit WWW pages to a requesting device that allow a user to participate in a WWW site. The transactions may take place over the Internet, WAN/LAN 200, or some other communications network.

Those of ordinary skill in the art will appreciate that the WWW server 300 may include many more components than those shown in FIG. 3. However, the components shown are sufficient to disclose an illustrative embodiment for practicing the present invention. As shown in FIG. 3, WWW server 300 is connected to WAN/LAN 200, or other communications network, via network interface unit 310. Those of ordinary skill in the art will appreciate that network interface unit 310 includes the necessary circuitry for connecting WWW server 300 to WAN/LAN 200, and is constructed for use with various communication protocols including TCP/IP and WAP protocols. Typically, network interface unit 310 is a card contained within WWW server 300.

WWW server 300 also includes processing unit 312, video display adapter 314, and a mass memory, all connected via bus 322. The mass memory generally includes RAM 316, ROM 332, and one or more permanent mass storage devices, such as hard disk drive 328, a tape drive, CD-ROM/DVD-ROM drive 326, and/or a floppy disk drive. The mass memory stores operating system 320 for controlling the operation of WWW server 300. It will be appreciated that this component may comprise a general purpose server operating system as is known to those of ordinary skill in the art, such as UNIX, LINUX™, or Microsoft WINDOWS NT®. Basic input/output system ("BIOS") 318 is also provided for controlling the low-level operation of WWW server 300.

The mass memory as described above illustrates another type of computer-readable media, namely computer storage media. Computer storage media may include volatile and nonvolatile, removable and non-removable media implemented in any method or technology for storage of information, such as computer readable instructions, data structures, program modules or other data. Examples of computer storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computing device.

The mass memory also stores program code and data for providing a WWW site. More specifically, the mass memory stores applications including WWW server application program 330, programs 334, and opinion application 336 (See figures and related discussion below). WWW server application program 330 includes computer executable instructions which, when executed by WWW server computer 300, generate WWW browser displays, including performing the logic described above. WWW server 300 may include a JAVA virtual machine, an SMTP handler application for transmitting and receiving email, an HTTP handler application for receiving and handing HTTP requests, JAVA applets for transmission to a WWW browser executing on a client computer, and an HTTPS handler application for handling secure connections. The HTTPS handler application may be used for communication with external security applications (not shown), to send and receive private information in a secure fashion.

WWW server 300 also comprises input/output interface 324 for communicating with external devices, such as a mouse, keyboard, scanner, or other input devices not shown in FIG. 3. Likewise, WWW server 300 may further comprise additional mass storage facilities such as CD-ROM/DVD-ROM drive 326 and hard disk drive 328. Hard disk drive 328 is utilized by WWW server 300 to store, among other things, application programs, databases, and program data used by WWW server application program 330. For example, customer databases, product databases, image databases, and relational databases may be stored.

FIG. 4 shows an exemplary mobile device 400, according to one embodiment of the invention. Mobile device 400 may be arranged to transmit and receive data. For instance, mobile device 400 may send and receive SMS text messages from other mobile devices (not shown) and servers (See FIG. 3 and related discussion) as well as receiving broadcasts. For example, mobile device 400 may receive radio broadcasts or television broadcasts. The data transmissions may take place over the Internet, WAN/LAN 200, or some other communications network.

Those of ordinary skill in the art will appreciate that mobile device 400 may include many more components than those shown in FIG. 4. However, the components shown are sufficient to disclose an illustrative embodiment for practicing the present invention. As shown in the figure, mobile device 400 includes processing unit 412, memory 448, RAM 416, ROM 432, operating system 420, application 430, programs 434, data storage 436, bios 418, power 426, input/output interface 424, wireless interface unit 410, LED 450, tuner(s) 452, audio 454, display 456, keypad 458, infrared input/output 460, and barcode input/output 462.

Mobile device 400 may connect to WAN/LAN 200, or other communications network, via wireless interface unit 410. Those of ordinary skill in the art will appreciate that wireless interface unit 410 includes the necessary circuitry for connecting mobile device 400 to WAN/LAN 200, and is constructed for use with various communication protocols including the TCP/IP protocol. Wireless interface unit 410 may include a radio layer (not shown) that is arranged to transmit and receive radio frequency communications. Wireless interface unit 410 connects mobile device 400 to external devices, via a communications carrier or service provider.

Mass memory 448 generally includes RAM 416, ROM 432, and one or more data storage units 436. The mass memory stores operating system 420 for controlling the operation of mobile device 400. It will be appreciated that this component may comprise a general purpose server operating system as is known to those of ordinary skill in the art, such as a version of UNIX, LINUX™, or Microsoft WINDOWS®. Basic input/output system ("BIOS") 418 is also provided for controlling the low-level operation of mobile device 400.

The mass memory as described above illustrates another type of computer-readable media, namely computer storage media. Computer storage media may include volatile and nonvolatile, removable and non-removable media implemented in any method or technology for storage of information, such as computer readable instructions, data structures, program modules or other data. Examples of computer storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computing device.

The mass memory also stores program code and data used within mobile device 400. More specifically, the mass memory stores applications including opinion application 430, and programs 434. Programs 434 may include computer executable instructions which, when executed by mobile device 400, transmit and receive WWW pages, e-mail, audio, video, and the like. One or more programs 434 may be loaded into memory 448 and run under control of operating system 420. Opinion application 430 performs the methods described below. Examples of application programs include radio tuner programs, phone programs, communication programs, productivity programs (word processing, spreadsheet, etc.), browser programs, and the like. Mobile computing device 400 also includes ROM 432. ROM 432 may be used to store data that should not be lost when mobile device 400 loses power.

Mobile device 400 also comprises input/output interface 424 for communicating with external devices, such as a headset, or other input or output devices not shown in FIG. 4. Data storage 436 is utilized by mobile device 400 to store, among other things, application programs, databases, and program data used by the mobile device broadcast delivery application. For example, user databases, product databases, image databases, and relational databases may be stored.

Keypad 458 may be any input device arranged to receive inputs from a user. For example, keypad 458 may include separate push buttons or a keyboard. Display 456 may be a liquid crystal display, or any other type of display commonly used in mobile devices. Display 456 may also be a touch screen arranged to receive a user's inputs. Infrared input/output 460 may be used to send and receive infrared commands. Barcode input/output 462 may be used in a manner consistent with barcode readers. For example, barcode input/output 462 may be used to scan and identify items having a barcode.

Power supply 426 provides power to mobile device 400. According to one embodiment, a rechargeable battery provides power. The power may be also be provided by an external power source, such as an AC adapter or a powered docking cradle that supplements or recharges the battery.

As shown, mobile device 400 includes light emitting diode (LED) display 450, tuner(s) 452, and audio interface 454. LED display 450 may be controlled to remain active for specific periods or events. For example, an LED display may stay on while the phone is powered or may light up in various patterns. The patterns may be a predetermined or random pattern. Audio interface 454 is arranged to receive and provide audio signals. For example, audio interface 454 may be coupled to a speaker (not shown) to provide audio from a telephone call, tuner(s) 452, or from some other audio source. Audio interface 454 may also be coupled to an input device, such as a microphone, to receive audio input. Tuner(s) 452 may be any tuner to receive a broadcast. For example, tuner(s) 452 may be an AM tuner, an FM tuner, an AM/FM tuner, an Internet radio tuner, a television tuner, and the like.

Figure 5:
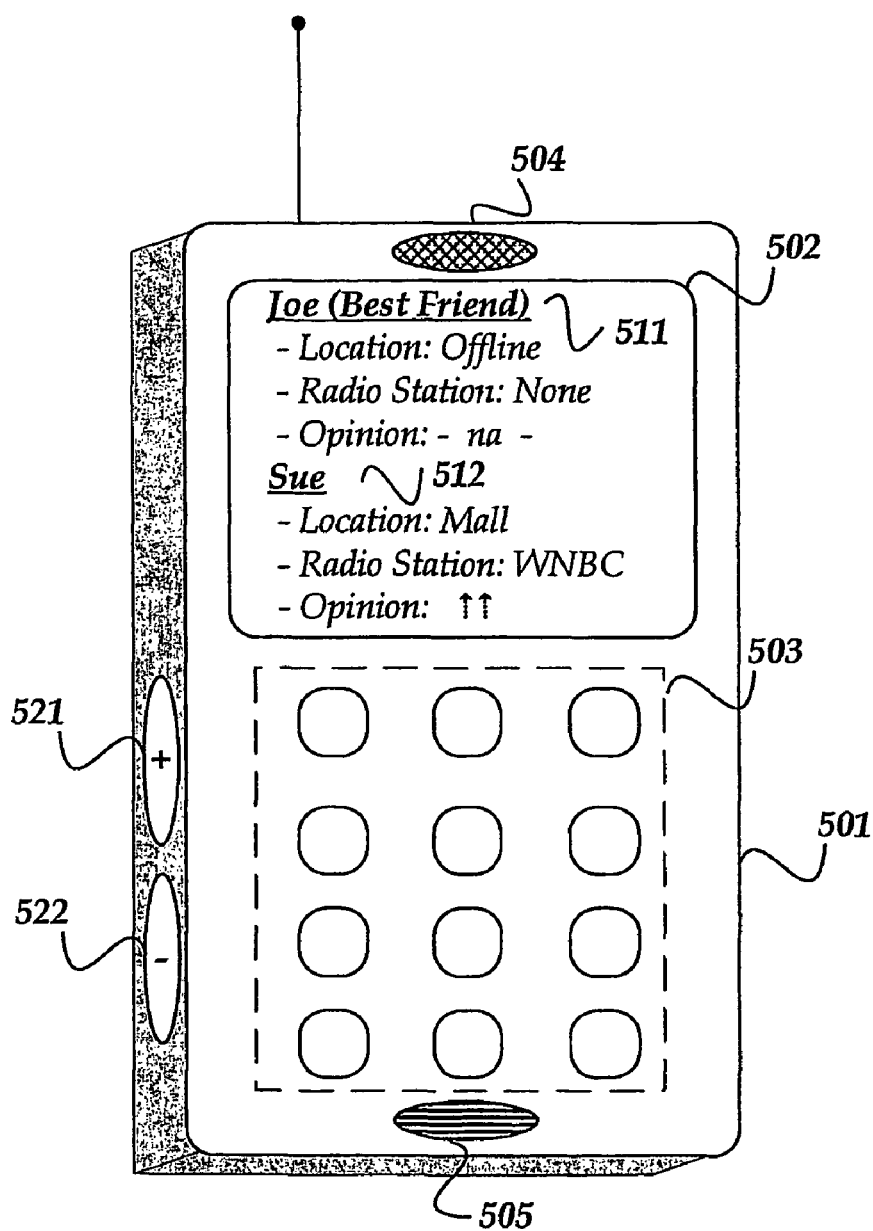
FIG. 5 illustrates another exemplary embodiment of a mobile device for expressing an opinion on an item and receiving aggregated opinion data.

FIG. 5 illustrates another exemplary embodiment of a mobile device for expressing an opinion on an item and receiving aggregated opinion data. Mobile device 501 is a cellular telephone having a display 502 and a set of twelve input keys 503 that form a telephone keypad. Mobile device 501 possesses one or more audio speakers 504 for generating audio data for users. Mobile device 501 also possesses an audio input microphone 505 for accepting audio input data from users. Devices 502-505 may be used when mobile device 501 operates as a telephone, radio, or as well as when mobile device 501 receives data such as broadcast data or Internet data. These devices may also be implemented using external headphones and microphones.

Mobile device 501 also possesses two additional user interface elements: positive opinion user interface 521 and negative opinion user interface 522. These two user interfaces provide a simple mechanism for enabling a user to input positive and negative opinions about an item. The item of the opinion may be identified in many different ways. The item may be automatically identified, manually identified, or a combination of automatic and manual identification. For example, items may be automatically determined from the location of mobile device 501 or the current state of the mobile phone. For example, a song currently playing on the mobile device may be automatically identified as the item of the opinion (See FIG. 13 and related discussion).

The user may depress positive opinion user interface 521 one or more times to provide an indication of his or her positive opinion of the song. A user may depress positive opinion user interface 521 multiple times, up to a predetermined number, to indicate the level of his or her positive opinion of the item. The predetermined number may be based on the desired scale for voting. For example, a scale of 1-10 may be used to indicate whether a user has a positive opinion or a negative opinion of the item. This information may be transmitted to a central database on a web server, along with identifying information ("ID") about the item. The ID is used to associate the opinion with the item. For example, if the user is voting on a current song being played, the ID may be the name of the song, the call letters of the station along with the time, or some other identifying information. A user may generate and transmit similar information indicating a negative opinion of the item, as well as the degree of the negative opinion about the item, by using negative opinion user interface 522 in the same manner as positive opinion user interface 521. Additionally, other user interface elements for inputting opinions may be implemented on the mobile device. For example, a key on the keypad, rocker switch, dial, pointer, soft keys on the display, and the like.

The device's display 502 may also provide data associated with a PAL LIST of other users of similar mobile devices. The PAL LIST may include one or more entries 511-512 for friends of the user. This list is similar to a friends or buddy list that may be part of instant messaging systems operating over the Internet. For each member of the PAL LIST, a set of status data for the individual user is displayed. This status data may include an indication of the user's location, an indication of the radio station currently being played (if any), and any current aggregated opinion data. For example, an entry for "Sue" 512 indicates that she is listening to a radio station identified as "WNBC" and that she has currently provided two (2) positive opinions for the song currently being played on that station. In contrast, Joe 511 is not currently online and is not providing information.

The PAL LIST mechanism includes a feature in which a particular user must "opt-in" or affirmatively agree to provide this status data to a requesting user of another mobile device 501 before the web server will share this data. The members of the PAL LIST may remove any previously granted permission to receive status data from a first user to block a second user from receiving information about the first user. As such, no user of the mobile devices will have status data shared with other individuals without their approval.

In addition, the status data may include location data indicating where the user of the mobile device is presently located. This information merely corresponds to a location selected by the user of mobile device 501 for display to authorized PAL LISTs. The user may enter any information desired to specify his or her location. The information may be selected from a list of predetermined favorite locations or expressly entered into the web browser.

In alternate embodiments, the mobile device may be a selected one of a pager, a personal digital assistant (PDA), a palm-sized computing device, a laptop computer, a portable radio, a portable MPx player, and a portable CD/DVD player.

Figure 6:
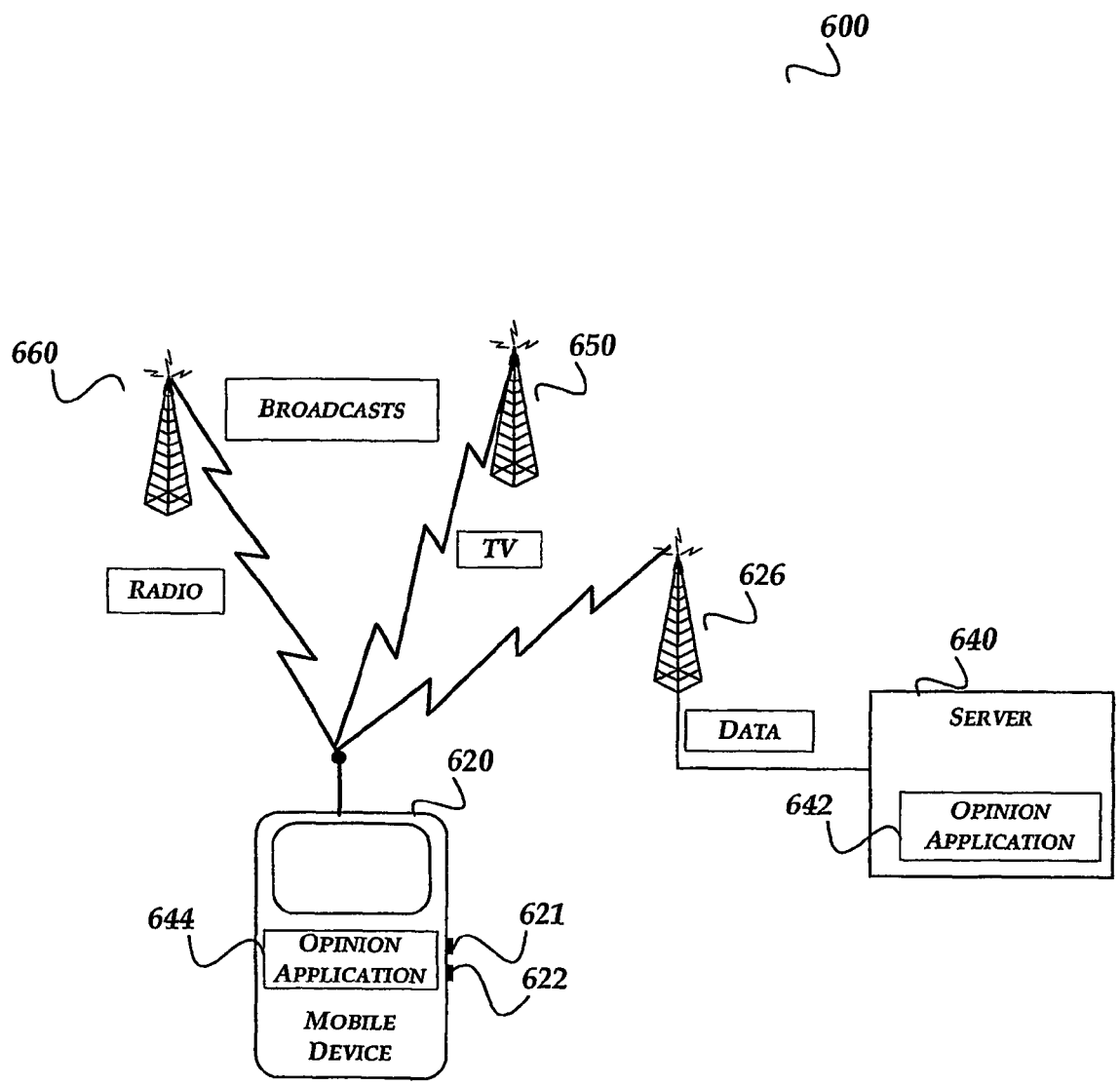
FIG. 6 is a functional block diagram generally illustrating one embodiment for expressing an opinion and receiving aggregated opinion data using a fixed computing device.

FIG. 6 is a functional block diagram generally illustrating one embodiment for expressing an opinion and receiving aggregated opinion data using a fixed computing device, in accordance with the present invention. In this implementation, server 640 is a computing device such as the one described above in conjunction with FIG. 3, and mobile device 620 is a mobile computing device such as the one described above in conjunction with FIG. 4 or FIG. 5. Opinion application 642 located on server 640 receives the opinion data from mobile device 620 and processes the opinion. The opinion data includes data relating to the opinion and other data indicating the item ID of the opinion. This other data may be an item ID or it may be data that can be used to determine the item ID, such as radio station & time. In addition, an ID of the mobile phone or of the class of user may be received by opinion application 642. Opinion application 642 may simply aggregate all opinions on a particular item or apply a probability theorem using the opinion, e.g., the Bayes theorem. Briefly described, the probability theorem answers the question: "given that an event that may have been the result of any of two or more causes has occurred, what is the probability that the event was the result of a particular cause?"

Mobile device opinion application 644 processes the opinion received when the user depresses positive opinion user interface 621 or negative opinion user interface 622. Mobile device 620 may maintain opinion data locally in its data storage 436 (shown in FIG. 4) in server's 640 data storage (shown in FIG. 3), or in some other data storage facility (not shown).

Figure 7:
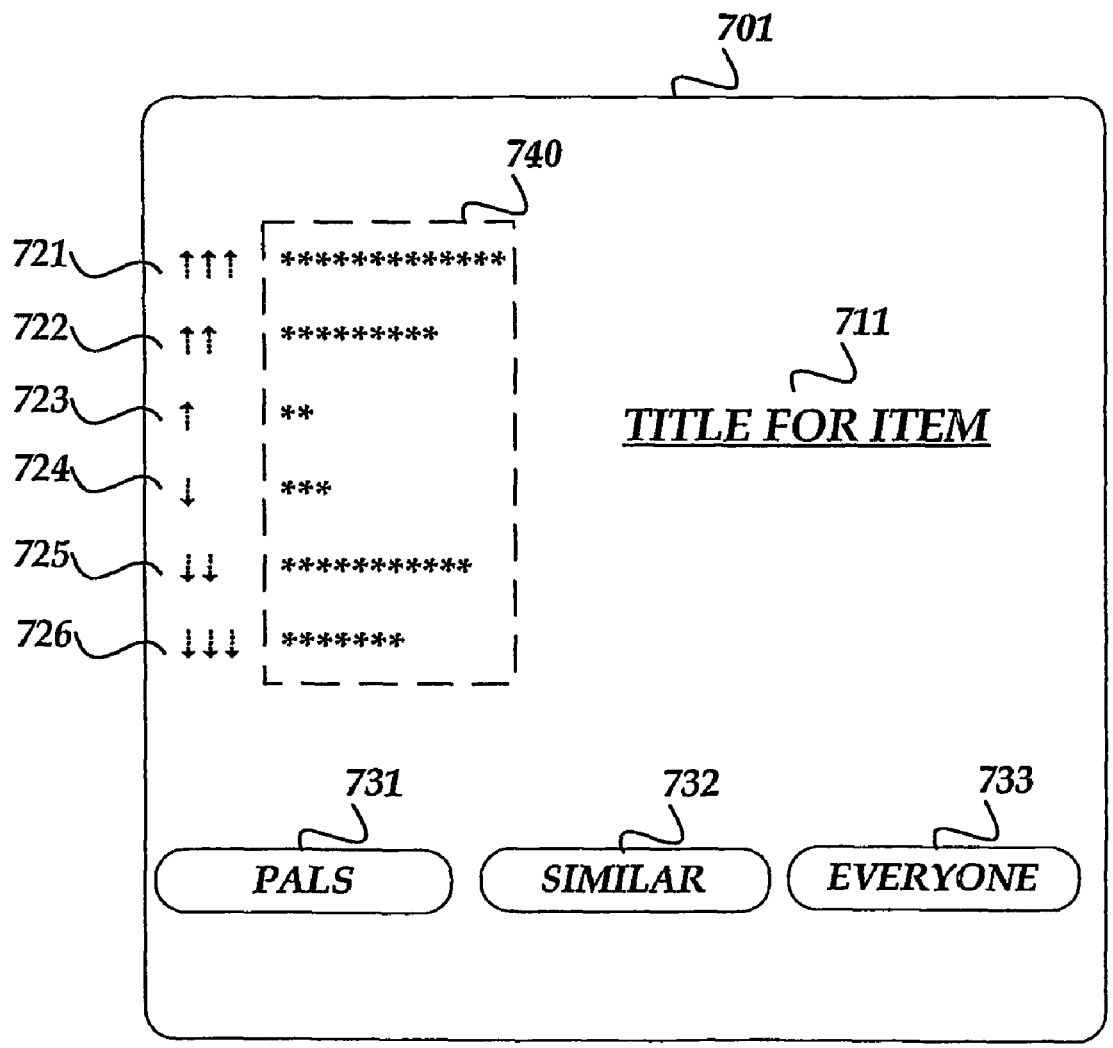
FIG. 7 illustrates an exemplary display for providing opinion data to users with mobile devices.

FIG. 7 illustrates an exemplary display for providing opinion data to users with mobile devices. Once the opinion data in the form of positive and negative opinions from users is obtained, the opinions may be aggregated and a display generated that indicates whether the item has a positive or negative opinion associated with it. The opinion data may include all indications received for a given item, or the opinion data may include indications from a particular group of users based on a user's preferences, demographic characteristics, previous patterns, and the like. The opinion data may be continuously updated to the mobile device, or may be updated according to some other schedule. A real-time indication of the current opinion regarding the item may be displayed on the mobile device. For example, while the user is listening to a particular song, the display may update to reflect the current opinion of the song. A new accumulation of opinion data based upon the item of the opinion may be started at any time. For example, if an opinion is expressed about the current weather, the opinion data may be reset according to a set time interval. According to this particular example, the opinions may be time-stamped and the incoming opinions processed based upon the time-stamp.

The aggregated opinion data is displayed to users in display 701 that may contain a title 711 identifying the item. The title may be the name of the item, song name, movie, product number, and the like. Display 701 may also provide a visual representation of the number of users who have provided positive and negative opinions. Display 701 may also show the levels 721-726 of the users opinions. Users may use this information in many different ways. For example, a user may decide to switch to a radio station based on the opinion data displayed. The user may also make a purchasing decision based on the information. The display may also provide mechanisms, such as user interface elements 731-733, to receive this data from various groups of individuals. For example, PALS user interface 731 may limit the data to only data received from other users found on their PAL LIST. Users may also select SIMILAR user interface 732 to limit the data to only people whose opinions are similar to their own. For example, the similar individuals may be generated based on the users previous opinions expressed and compared with other similar users who have expressed opinions in the system. Similarly, an EVERYONE user interface 733 may be used to receive all of the data received regarding this target. Of course, any other groups of users may be generated automatically or manually. The groups may be generated based on a user's preferences, demographic data, and the like.

Figure 8:
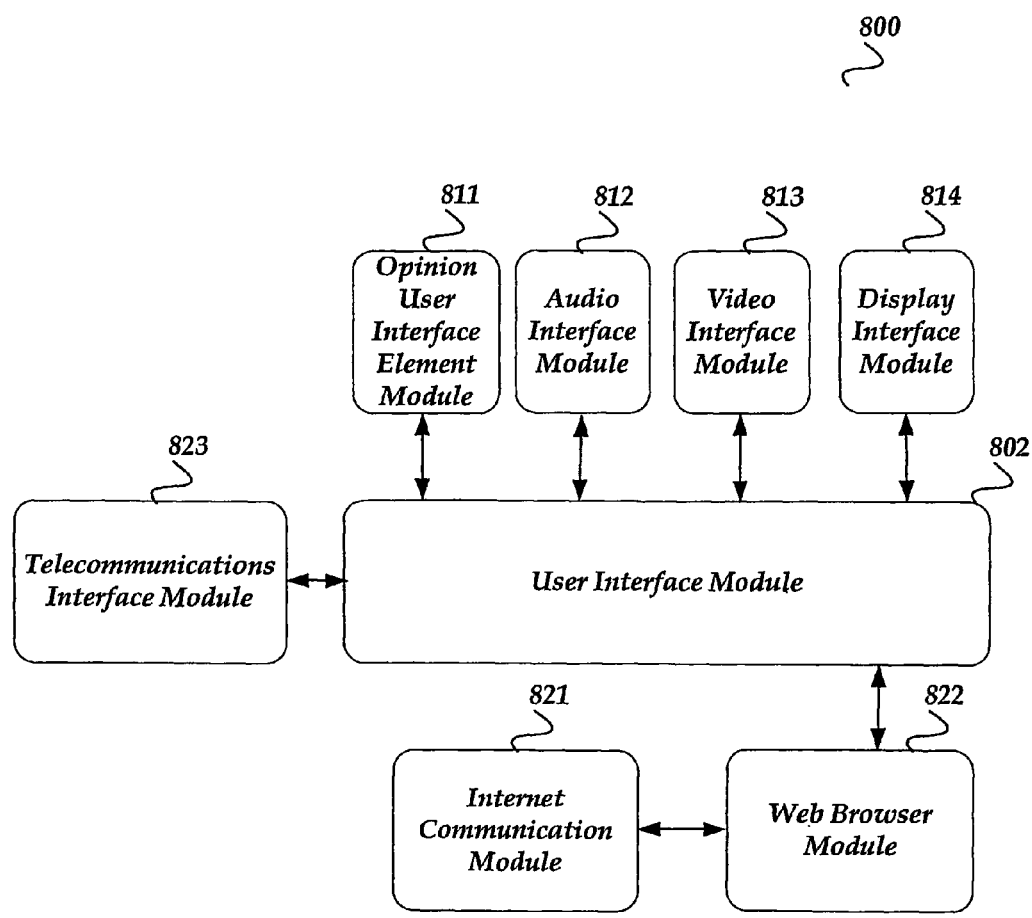
FIG. 8 illustrates a functional block diagram for a mobile device opinion system.

FIG. 8 illustrates a functional block diagram for a mobile device opinion system, according to one embodiment of the invention. Opinion system 800 includes user interface module 802 that interacts with the user of the device through a set of modules. These modules include opinion user interface element module 811, audio interface module 812, video interface module 813, and display interface module 814.

Opinion user interface element module 811 receives the positive or negative opinion from the mobile device when a user selects either the positive opinion user interface element or the negative opinion user interface element. Opinion user interface element module 811 determines if multiple inputs to one of the opinion user interface elements has been made within a predetermined time to provide an increased level of approval or disapproval. The predetermined time may be preprogrammed within the device or may be set by the user. Interface module 811 may also generate a data message containing the opinion data and the ID of the item to a server on the network.

Audio interface module 812 processes the audio broadcast data received from all sources, including any broadcast tuners (not shown), web browser module 822, telecommunications interface module 823 and any other sources of audio data. Audio interface module 812 performs any processing necessary to format and decode any audio data so that it may be output to the user. This module may process audio data in any format including sampled analog data and encoded audio data as well as merely control the output of an analog signal received from the radio tuner.

Video interface module 813 processes video broadcast data received that is to be displayed as a rendered image on the mobile device's display. Video interface module 813 processes the data to display web pages rendered from a mark-up language such as HTML, static graphic images in any format, such as GIF, JPEG, TIFF, BMP, and similar representations of audio data, and video sequences of images such as streaming video, QUICKTIME movies, MPEG movies and similar representations of video data.

Display interface module 814 processes any data that specifies how user interface elements are displayed on the mobile device, such as the color, intensity. As discussed above, LEDs may be placed on the mobile device and display various patterns. For example, LEDs of various colors may be associated with user interface elements. As such, display interface module 814 processes received data to illuminate various user interface elements as desired.

User interface module 802 interacts with the telecommunications interface module 823 to process any telephone call related operations of the device. User interface module 802 also interacts with web browser module 822 to receive, process and display Internet-related data Broadcast related modules interact with user interface module 802 to receive and output radio related data to a user.

Web browser module 822 communicates with web sites on the Internet through Internet communications module 821. Web browser module 822 receives the web page data and renders the image corresponding to the data and web pages that are displayed to the user. Internet communication module 821 performs the communications functions necessary to connect to the Internet as well as send and receive web page data that may be specified in a web page mark-up language such as HTML, WML, or similar web page specification languages.

Figure 9:
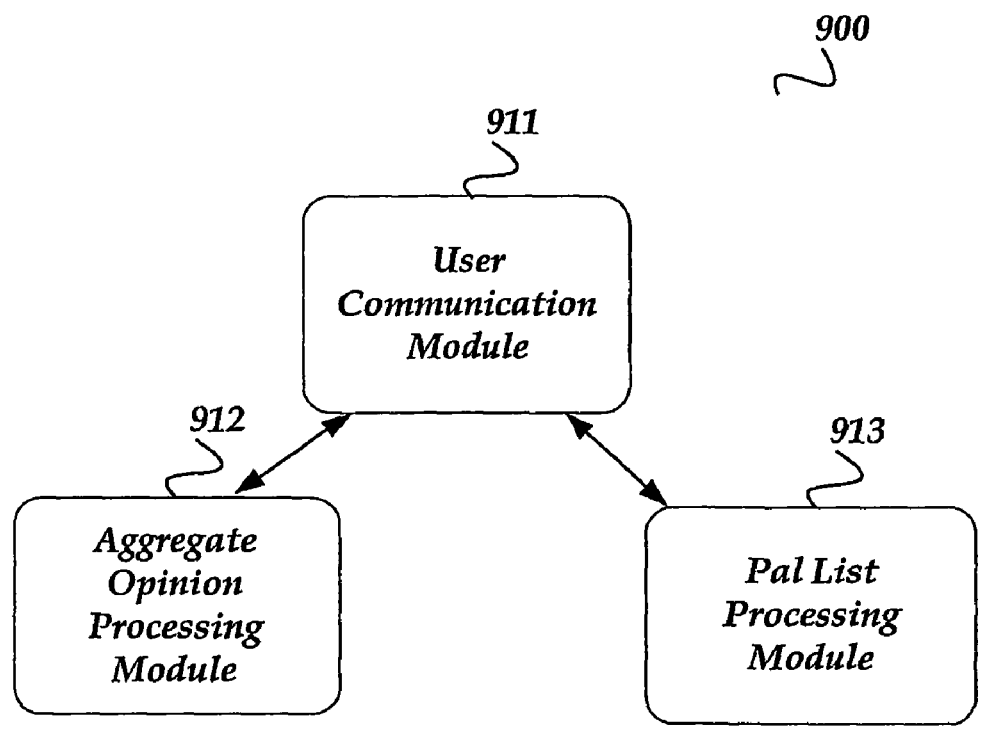
FIG. 9 illustrates a functional block diagram for a server opinion application.

FIG. 9 illustrates a functional block diagram for a server opinion application, according to one embodiment of the invention. Server-based application 900 includes user communication module 911, aggregate opinion processing module 912, and PAL LIST processing module 913 to provide the services to enable the above operations of the mobile device. User communication module 911 receives and processes the incoming messages from mobile devices that indicate that the device is logging into the network, providing opinion data, updating the user's PAL LIST, and the like. User communication module 911 interacts with PAL LIST Processing module 913 when the user logs in to both inform other on-line users that the user has logged in as well as retrieve the current status of the user's PAL LIST. PAL LIST processing module 913 maintains the current status of users on the network and provides the status data to specify the current state of the PAL LIST. PAL LIST processing module keeps track of each user's PAL LIST.

Alternatively, when a user requests aggregate information, the user sends a server the PAL LIST which is extracted by the server. User communication module 911 interacts with aggregated opinion processing module 912 when a user sends opinion data. Aggregated opinion processing module 912 maintains and update the current summaries of aggregated opinion data that may be provided to users. The aggregated opinion processing module aggregates the data for each unique item within its database in response to receiving a new opinion from a mobile device. The information received by aggregated opinion module 912 may be received from many different sources. For example, the server may receive play list information directly from a radio station and combine that information together with the current radio station tuned by a mobile device and the current time on the mobile device to determine the item of the opinion.

Figure 10:
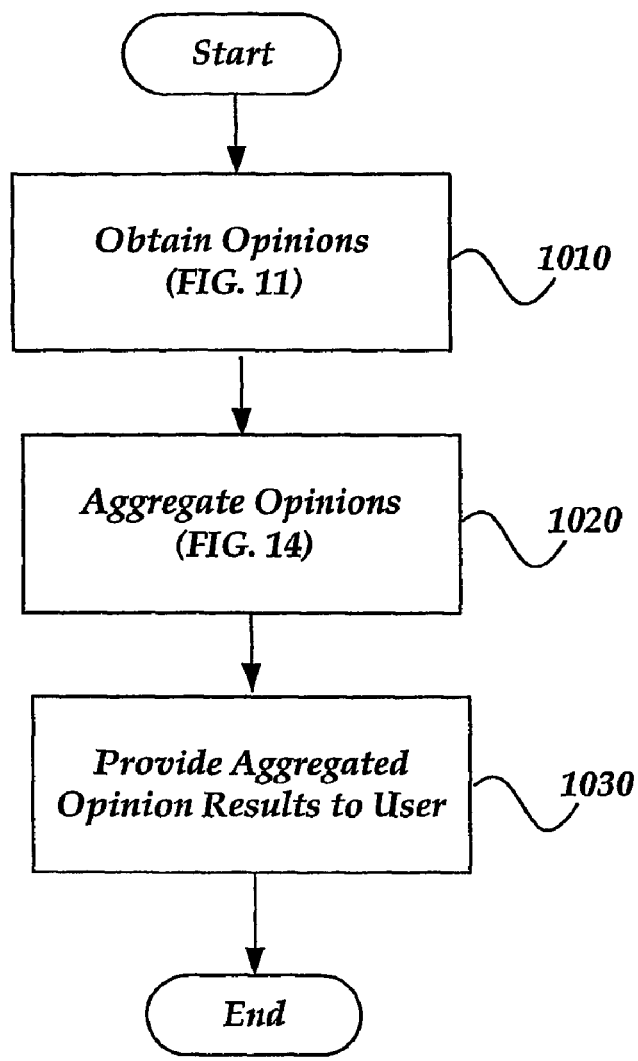
FIG. 10 illustrates an overview of the process for implementing an opinion system.

FIG. 10 illustrates an overview of the process for implementing an opinion system according to an embodiment of the invention. After a start block, the process advances to block 1010, at which point the opinions are obtained. Briefly described, positive and negative opinions are obtained from the user about a particular item (See FIG. 11 and related discussion). Moving to block 1020, the opinions are aggregated. Opinions may be aggregated in many different manners. For example, opinions may be aggregated based on predetermined lists, a user's preferences, demographic characteristics, and the like (See FIG. 14 and related discussion). Transitioning to block 1030, the result of the processed aggregated opinion data is provided to users. The process then returns to processing other actions.

Figure 11:
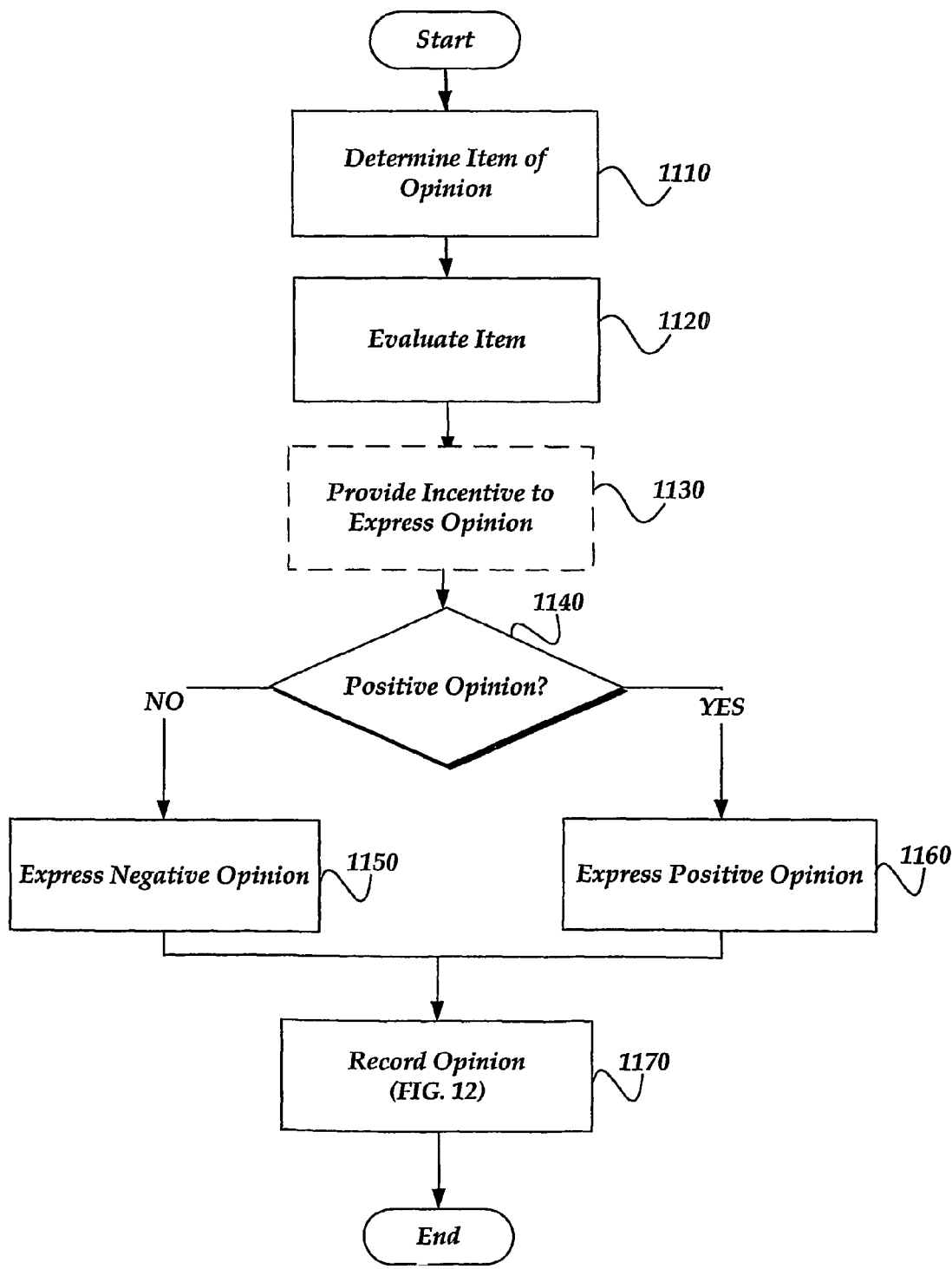
FIG. 11 illustrates an overview of a process for obtaining an opinion.

FIG. 11 illustrates an overview of a process for obtaining an opinion according to an embodiment of the invention. After a start block, the process moves to block 1110, at which point the user determines the item on which to express an opinion (See FIG. 13 and related discussion). Generally, the item may be determined by context automatically, manually, or a combination of automatic and manual identification. Moving to block 1120, the item is evaluated by the user. Specifically, the user determines whether he or she has a positive or negative opinion of the item. Transitioning to block 1130, an incentive may be provided to entice the user to express an opinion about the item. For example, the user may receive an incentive of a rebate. Flowing to decision block 1140 a determination is made as to whether the user has a positive or negative opinion about the item. When the user has a positive opinion, the user expresses a positive opinion about the item (block 1150). Otherwise, the user expresses a negative opinion (block 1160). The opinion is then recorded in a database (See FIG. 12 and related discussion.) The process then returns to processing other actions.

Figure 12:
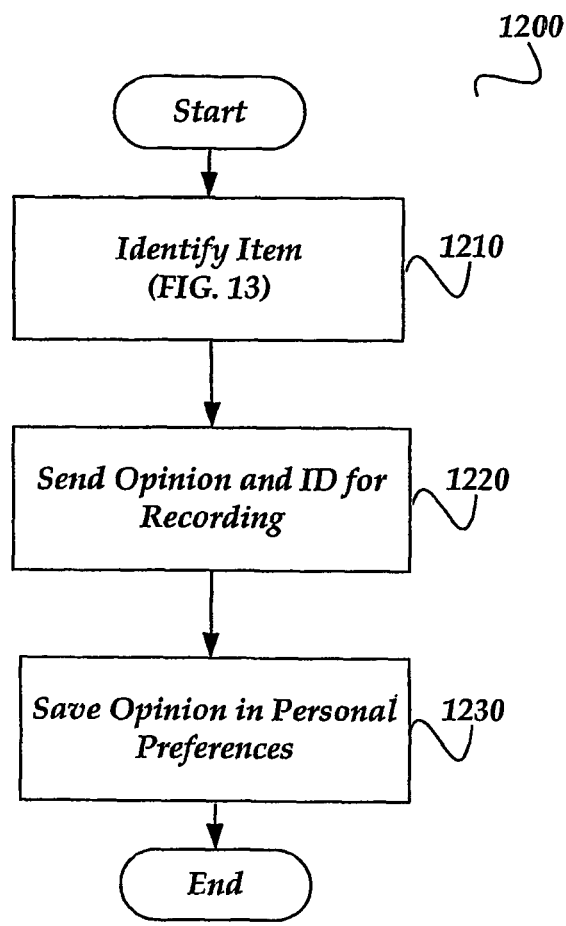
FIG. 12 illustrates a process for recording an opinion.

FIG. 12 illustrates a process for recording an opinion, according to one embodiment. After a start block, the process advances to block 1210, at which point the item is identified and an ID assigned to the item. The identity information may be the name of the item, the subject of the opinion, the product number, and the like (See FIG. 13 and related discussion). Moving to block 1220 the opinion along with the ID is sent to a server for recording in a database. The opinion and ID is also used to update the user's preferences (block 1230). The process then returns to processing other actions.

Figure 13:
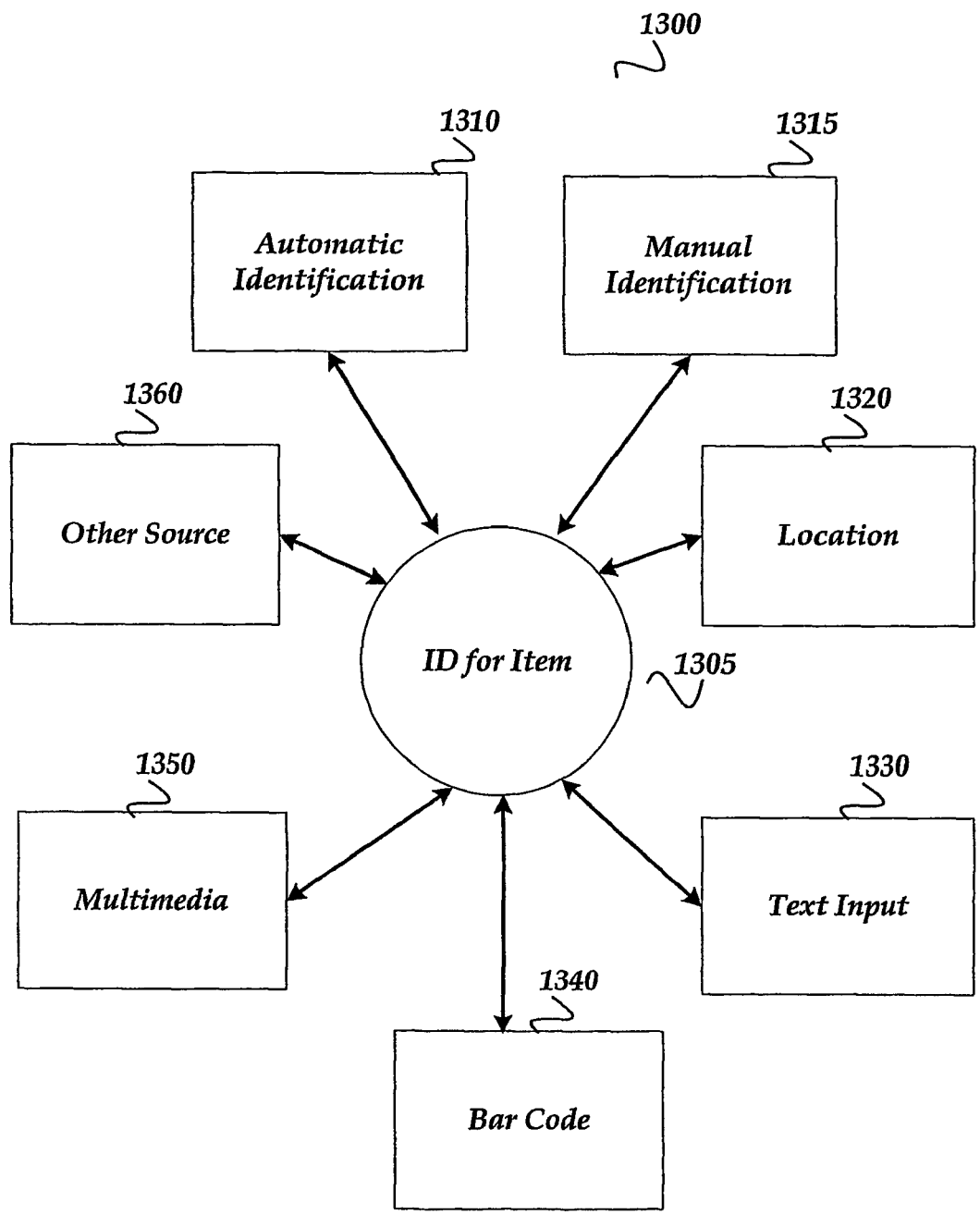
FIG. 13 illustrates an identifying system containing a set of exemplary identification routines.

FIG. 13 illustrates an identifying system for an opinion containing a set of exemplary identification routines. Generally, the identification routines shown in the figure consist of routines that are implemented to identify an item. ID routine 1305 communicates with a variety of identification routines to obtain an ID for the item. The ID may be provided in many different ways. For example, the ID may be automatically identified (routine 1310), manually identified (routing 1315), or a combination of automatic and manual identification. This is different from a web site that merely includes a static link to vote on an item. According to aspects of the present invention, the target of the opinion is selected by the user.

Automatic identification (routine 1310) may be determined by context. For example, suppose the user desires to express an opinion about a song that is currently playing on the mobile device. The mobile device may obtain or maintain the identifying information relating to the song as it is playing. This may be achieved in many different ways. For example, RDS data transmitted by the radio station to the mobile device may be used to determine the current song information. Additionally, a remote data source may be accessed to identify the songs that are currently being played. Radio broadcasts are highly automated and their song list information is typically available from a source that maintains play lists. Alternatively, the mobile device may send the time and radio station to a server to determine the current song being played. For example, the server may retrieve the name of the song based on the time and radio station information. Additionally, an identification may be stored relating to what is currently being displayed on the screen.

An item may automatically be identified in response to a received message. For example, an SMS message may be received by the mobile device requesting the user to express an opinion about a television show, a person, an event, a song, a movie, and the like.

The item of the opinion may also be automatically determined based on the location of the mobile device (Location routine 1340). For example, when the user is standing outside of a restaurant the restaurant may be the item of the opinion. A GPS, or some other device may be used to identify the location of the item. The location may also be manually entered by the user of the mobile device. A server may also store a database of businesses including their corresponding locations to identify the item of the opinion.

Manual identification routine 1315 may be used to manually enter the ID information. Manual identification may be entered by bar code information (routine 1340), text input (routine 1330), or some other source (routine 1360). Manual identification may also be used with automatic identification routine 1310. For example, a song may be playing on the mobile device when the user is located within a restaurant that may be a target of an opinion. In this situation, the user has a choice to express an opinion about the song or the restaurant. In response to the user's actions or choices, the mobile device requests the user to choose between expressing an opinion about the song currently playing or the restaurant.

Bar Code routine 1340 may be used to determine the ID of the item through manually scanning a bar code. For example, the bar code may be scanned and the ID stored in the phone until needed. The identifying information contained within the bar code may be associated with the item. For example, if the user is in a store and wants to express an opinion on a product, the user can scan the product and then select positive or negative opinion user interface element(s) to express an opinion about the item. Bar code routine 1320 may store information relating to the bar code within the phone or may access an external database to identify the product. For example, the mobile device may send the bar code information to a server that maintains the corresponding identifying information relating to the bar code.

The user may manually identify the item by text input (routine 1330). For example, the user may enter a textual input describing the product into the mobile device. The input may include the name, the model number, the topic, and the like.

Multimedia routine 1350 allows the user to identify the information by an audio or visual description. For example, the user may record an audio description of the item or may take a picture of the item. These descriptions may be processed automatically (i.e. touchtone phone input) or sent to another source for identification. The source, such as a server, may match the multimedia information to information it has stored to determine the target of the opinion.

Additionally, the item may be identified by some other source (routine 1360). The other source may include messages sent to the mobile device from another user or business the user wishes to receive information from. For example, the user may receive an SMS message from an individual on their PAL list requesting the user to express an opinion about some topic or item.

Figure 14:
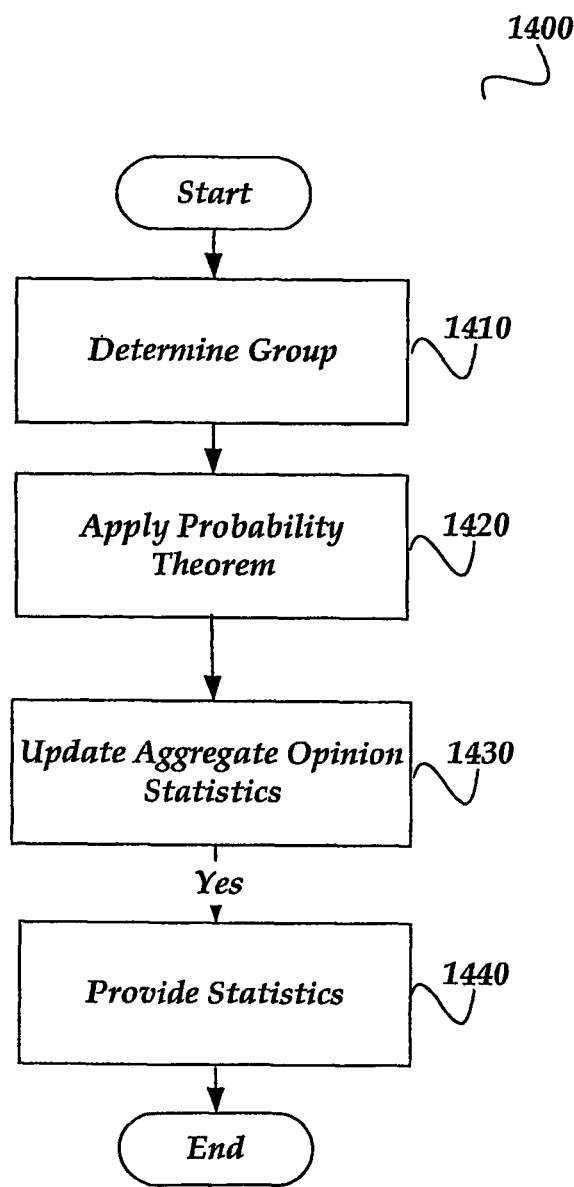
FIG. 14 shows processing the aggregated opinions, in accordance with the invention.

FIG. 14 shows processing the aggregated opinions according to an embodiment of the invention. After a start block, the process moves to block 1410 to determine group of users with which to aggregate the opinion. The group of users may be users with similar interests to the user, may be a predefined list, may be all users, and the like. Moving to block 1420, a probability theorem is applied to the groups aggregated opinions. The probability theorem may be used to estimate the probability that a particular user, or group of users, will have a positive or negative opinion about an item. Alternatively, some other estimating process may be applied to the opinions. Next, at block 1430, the aggregated opinion statistics are updated. Moving to block 1340, the result of the analysis of the aggregated opinion data is provided to the user.

The above specification, examples and data provide a complete description of the manufacture and use of the composition of the invention. Since many embodiments of the invention can be made without departing from the spirit and scope of the invention, the invention resides in the claims hereinafter appended.

We claim:

1. A mobile device that provides for telecommunication and provision of opinions relating to items, comprising:
   a body of the mobile device to house mobile device components, the body having dimensions designed to allow mobile usage of the mobile device by a user;
   a telecommunication module, housed by the body and configured to facilitate telecommunication by the user of the mobile device with another party;
   a processor, housed by the body;
   a user interface element, housed by the body and operated by the processor to facilitate a user to provide opinion inputs;
   a wireless interface, housed by the body and coupled to the telecommunication module and the processor to send telecommunication or opinion data and receive aggregated opinion data; and
   an opinion application, housed by the body and operated by the processor to
      facilitate a user of the mobile device in selecting an item on which to provide an opinion input,
      associate a received opinion input with the selected item,
      send the received opinion, as well as identification information identifying the selected item to which the sent opinion relates, through the wireless interface, to another device for aggregation with other opinion data provided by other users for the selected item,
      receive aggregated opinion data for at least the selected item, and
      customize one or more user preferences of the mobile device based on the received aggregated opinion data for at least the selected item.

2. The mobile device of claim 1, wherein said opinion application is operated by the processor to said facilitate, and said facilitate comprises facilitate the mobile device user in selecting an opinion provision context of the mobile device, the opinion provision context including the selected item.

3. The mobile device of claim 2, wherein
   the mobile device further comprises a tuner configured to receive a radio broadcast, and a player configured to play the received radio broadcast; and
   the opinion application is equipped to (a) facilitate the mobile device user in selecting the current radio broadcast being played by the player as the item to provide opinion input on, when the opinion provision context of the mobile device is the current radio broadcast being played, and (b) send a first identifier directly/indirectly identifying the radio broadcast and a second identifier identifying the first identifier as an identifier identifying a radio broadcast, as said identification information identifying the item.

4. The mobile device of claim 2, wherein
   the mobile device further comprises a location device configured to provide a location of the mobile device; and
   the opinion application is equipped to (a) facilitate the mobile device user in selecting an item to be inferred from the location of the mobile device as the item to provide opinion input on, when the opinion provision context of the mobile device is the location of the mobile device; and (b) send a first identifier identifying the location of the mobile device and a second identifier identifying the first identifier as an identifier identifying a location of the mobile device, as said identification information identifying the item.

5. The mobile device of claim 2, wherein
   the mobile device further comprises a barcode device configured to read a barcode; and
   the opinion application is equipped to (a) facilitate the mobile device user in selecting an item identified by the barcode as the item to provide opinion input on, when the opinion provision context of the mobile device is the barcode read the barcode device; and (b) send a first identifier comprising the barcode, and a second identifier identifying the first identifier as a barcode, as said identification information identifying the item.

6. The mobile device of claim 2, wherein
   the mobile device further comprises a keypad device configured to facilitate a user in inputting an item identifier; and
   the opinion application is equipped to (a) facilitate the mobile device user in selecting an item identified by the received item identifier as the item to provide opinion input on, when the opinion provision context of the mobile device is the item identifier received through the keypad device; and (b) send a first identifier comprising the received item identifier, and a second identifier identifying the first identifier as a received item identifier, as said identification information identifying the item.

7. The mobile device of claim 2, further comprising an input/output interface configured to facilitate the mobile device user in selecting the opinion provision context of the mobile device from a list of opinion provision contexts.

8. The mobile device of claim 7, wherein the list of opinion provision contexts comprises a current broadcast being played on the mobile device, a location of the mobile device, a manually inputted item identifier, and a barcode read by the mobile device.

9. The mobile device of claim 1, wherein the user interface element configured to facilitate a user in providing opinion inputs comprises a number of levels to facilitate the user in indicating a degree of the opinion.

10. The mobile device of claim 1, wherein
the wireless interface is also configured to receive aggregated opinion data;
the mobile device further comprises a display to display the received aggregated opinion data; and
the opinion application is also communicatively coupled to the display to control said reception and display of the aggregated opinion data.

11. The mobile device of claim 10, wherein the opinion application is also equipped to request the aggregated opinion data.

12. The mobile device of claim 11, wherein the opinion application is also equipped to automatically make the request in view of an opinion on a selected item provided.

13. The mobile device of claim 10, wherein the opinion application is also equipped to request the aggregated opinion data to be sent to other mobile devices.

14. The mobile device of claim 13, wherein the other mobile devices corresponds to a predetermined list of other users, and the predetermined list corresponds to a selected one of a PAL LIST selected by the user, a group of similar users generated based on the user's preferences, and a group of all users.

15. A mobile device that provides for telecommunication and provision of opinions relating to items, comprising:
a body of the mobile device to house mobile device components, the body having dimensions designed to allow mobile usage of the mobile device by a user;
a telecommunication module, housed by the body and configured to facilitate telecommunication by the user of a mobile device with another party;
a processor, housed by the body;
a first selected one of
a tuner-player combination, housed by the body, to receive and play a broadcast,
a location device, housed by the body, to identify a location of the mobile device,
a barcode device, housed by the body, to read a barcode of an item, and
a keypad, housed by the body, to facilitate the user in entering an item identifier identifying an item;
a user interface element, housed by the body and operated by the processor to facilitate the user to provide opinion inputs;
a wireless interface, housed by the body and coupled to the telecommunication module and the processor, the wireless interface configured to send telecommunication data or opinion data and to receive aggregated opinion data; and
an opinion application, housed by the body and operated by the processor to associate the received opinion input with a first corresponding selected one of
a broadcast being played by the tuner-player combination,
an item to be inferred based on the location of the mobile device,
an item identified by the barcode read, and
an item identified by an item identifier entered by the user,
send the received opinion, as well as identification information identifying the
item to which the sent opinion relates, through the wireless interface, to another device for aggregation with other opinion data provided by other users for the selected item,
receive aggregated opinion data for at least the selected item, and
customize one or more user preferences of the user of the mobile device based on the received aggregated opinion data for at least the selected item.

16. The mobile device of claim 15, wherein the mobile device further comprises a second selected one of the remaining unselected ones of
a tuner-player combination to receive and play a broadcast,
a location device to identify a location of the mobile device,
a barcode device to read a barcode of an item,
a keypad to facilitate a user in entering an item identifier identifying an item; and
the opinion application is equipped to
associate the received opinion input with a selected one of
a first and a second corresponding selected one of
a broadcast being played by the tuner-player combination,
an item to be inferred based on the location of the mobile device,
an item identified by the barcode read, and
an item identified by an item identifier entered by the user.

17. The mobile device of claim 16, wherein the mobile device further comprises a third selected one of the remaining unselected ones of
a tuner-player combination to receive and play a broadcast,
a location device to identify a location of the mobile device,
a barcode device to read a barcode of an item,
a keypad to facilitate a user in entering an item identifier identifying an item; and
the opinion application is equipped to
associate the received opinion input with a selected one of
a first, a second and a third corresponding selected one of
a broadcast being played by the tuner-player combination,
an item to be inferred based on the location of the mobile device
an item identified by the barcode read, and
an item identified by an item identifier entered by the user.

18. A system for aggregating opinions, comprising:
a memory for storing logical instructions;
a network interface unit for sending and receiving data relating to aggregated opinions; and
a processor for executing the logical instructions stored in the memory, the execution of the logical instructions causing functions to be performed, including:
receiving opinion data from an opinion application on a mobile device;
determining an opinion based on the received opinion data;
determining an item to which the received opinion relates;
aggregating the opinion with other opinions received from other mobile devices for the item;
producing aggregated opinion data based on said aggregating of the opinion, including applying a probability calculation to the aggregated opinion, the probability calculation based at least in part on one or more known user preferences; and
sending the aggregated opinion data to a set of mobile devices in non-audio form to customize one or more user preferences of a user of at least one of the set of mobile devices based on the aggregated opinion data.

19. The system of claim 18, wherein said aggregating of the opinion with other opinions received from other mobile devices further comprises keeping track of each unique opinion received.

20. The system of claim 18, wherein the probability calculation is performed in accordance with a probability theorem.

21. The system of claim 18, wherein said determining of the opinion based on the opinion data comprises associating the opinion with an item.

22. The system of claim 21, wherein said determining of an item to which the received opinion relates comprises parsing the opinion data to extract one or more identifiers that uniquely identify the item.

23. The system of claim 22, wherein the one or more identifiers comprise at least a selected one of the set of identifiers including a song name, a barcode, a SKU number, a text name, call letters, and a location.

24. The system of claim 18, wherein the other mobile devices correspond to a predetermined list of users.

25. The system of claim 24, wherein the predetermined list corresponds to one of the following: a PAL LIST provided by a user of the mobile device, a group of similar users generated based on the user's preferences, and a group of all users.

26. The system of claim 24, said execution of the logical instructions further causes the function of receiving from the mobile device the predetermined list to be performed.

27. In a computing environment, a method for collecting, aggregating and distribution opinion, comprising:
receiving a plurality of transmissions of opinion data from an opinion application on one or more mobile devices;
determining an opinion based on each received transmission of opinion data;
determining an item to which the received opinion relates;
aggregating the opinion with other opinions received from opinion applications on other mobile devices for the item;
producing aggregated opinion data based on said aggregating of the opinion, including applying a probability calculation to the aggregated opinion, the probability calculation based at least in part on one or more known user preferences; and
sending the aggregated opinion data to a set of mobile devices in non-audio form to customize one or more user preferences of a user of at least one of the set of mobile devices based on the aggregated opinion data.

28. The method of claim 27, further comprising:
generating a result, by the mobile device, based on the aggregated opinion; and
providing the result to a user.

29. The method of claim 28, wherein the other opinions correspond to opinions expressed by users in a predetermined list.

30. The method of claim 29, wherein the predetermined list corresponds to a PAL LIST.

31. The method of claim 30, wherein the predetermined list is generated based on the user's preferences.

32. The mobile device of claim 27, wherein the item to which the received opinion relates is a broadcast, a location, an item identified by a manually inputted item identifier, an item identified by an item identifying message, and an item identified by a barcode.

33. A mobile device that provides for telecommunication and provision of opinions, comprising:
a body housing means of the mobile device, the body housing means having dimensions designed to allow mobile usage of the mobile device by a user;
means, housed by the body housing means, for telecommunication by the user of the mobile device with another party;
processing means, housed by the body housing means;
means, housed by the body housing means, for receiving an opinion from the user;
means, housed by the body housing means, for selecting an item to which the opinion relates and for associating the opinion input with the selected item;
means, housed by the body housing means, for sending the opinion, as well as identification information directly/indirectly identifying the selected item to which the opinion relates, to another device for aggregation with other opinion data provided by other users for the selected item;
means, housed by the body housing means, for receiving aggregated opinion data for at least the selected item; and
means, housed by the body housing means, for customizing one or more user preferences of the user of the mobile device based on the received aggregated opinion data for at least the selected item.

34. The mobile device of claim 33, wherein
the mobile device further comprises means, housed by the body housing means, to tune and play a broadcast; and
said sending means includes means to include with said identification information an identifier identifying a broadcast, when the broadcast is the selected item to which the opinion relates.

* * * * *

UNITED STATES PATENT AND TRADEMARK OFFICE
CERTIFICATE OF CORRECTION

PATENT NO. : 7,319,863 B2
APPLICATION NO. : 10/477164
DATED : January 15, 2008
INVENTOR(S) : Engstrom et al.

It is certified that error appears in the above-identified patent and that said Letters Patent is hereby corrected as shown below:

Column 15

Line 64, Claim 2, "by the processor to said facilitate, and said facilitate comprises facilitate the mobile device user" should read --by the processor to facilitate the mobile device user--

Signed and Sealed this

Ninth Day of November, 2010

David J. Kappos
*Director of the United States Patent and Trademark Office*